US008219551B2

(12) United States Patent
Tirpak

(10) Patent No.: US 8,219,551 B2
(45) Date of Patent: Jul. 10, 2012

(54) DECODING A HIERARCHICAL MULTI-LAYER DATA PACKAGE

(75) Inventor: Tom Tirpak, Glenview, IL (US)

(73) Assignee: General Instrument Corporation, Horsham, PA (US)

( * ) Notice: Subject to any disclaimer, the term of this patent is extended or adjusted under 35 U.S.C. 154(b) by 242 days.

(21) Appl. No.: 11/930,462

(22) Filed: Oct. 31, 2007

(65) Prior Publication Data

US 2009/0112898 A1 Apr. 30, 2009

(51) Int. Cl.
*G06F 17/00* (2006.01)
(52) U.S. Cl. .................................. 707/728; 707/749
(58) Field of Classification Search .............. 707/1–10, 707/101, 728, 749, 999.001–999.01, 705, 707/706
See application file for complete search history.

(56) References Cited

U.S. PATENT DOCUMENTS

| | | | |
|---|---|---|---|
| 5,995,095 A | 11/1999 | Ratakonda | |
| 6,263,313 B1 | 7/2001 | Milsted et al. | |
| 6,539,391 B1 | 3/2003 | DuMouchel et al. | |
| 2001/0012404 A1 | 8/2001 | Kondo | |
| 2002/0010679 A1 | 1/2002 | Felsher | |
| 2003/0101169 A1 | 5/2003 | Bhatt et al. | |
| 2003/0110130 A1 | 6/2003 | Pelletier | |
| 2003/0208473 A1 | 11/2003 | Lennon | |
| 2004/0073535 A1 | 4/2004 | Iwasaki | |
| 2004/0153569 A1 | 8/2004 | Savathphoune | |
| 2004/0234000 A1 | 11/2004 | Page | |
| 2004/0264568 A1* | 12/2004 | Florencio | 375/240.12 |
| 2005/0027696 A1 | 2/2005 | Swaminathan et al. | |
| 2006/0053169 A1 | 3/2006 | Straub et al. | |
| 2006/0155957 A1* | 7/2006 | Lee et al. | 712/24 |
| 2007/0067728 A1* | 3/2007 | Lo et al. | 715/751 |
| 2010/0322529 A1 | 12/2010 | Amouou et al. | |

FOREIGN PATENT DOCUMENTS

| | | |
|---|---|---|
| EP | 340039 | 11/1989 |
| WO | 9736376 | 10/1997 |

OTHER PUBLICATIONS

PCT International Search Report, RE: PCT Application #PCT/US2008/080967 Oct. 23, 2008.
EPC Extended Search Report, RE: Application #08843495.6-2223/2217997, PCT/US2008080967; Dec. 28, 2010.
Yang, et al, "An Information Delivery System With Automatic Summarization for Mobile Commerce", Decision Support Systems, Elsevier Science Publishers, Amsterdam, NL, vol. 43, No. 1, pp. 46-61; Jan. 12, 2007.

(Continued)

*Primary Examiner* — Mohammad Ali
*Assistant Examiner* — John Hocker
(74) *Attorney, Agent, or Firm* — Lori Anne D. Swanson

(57) ABSTRACT

A hierarchical decoder is operable to decode a hierarchical multi-layer data package. The hierarchical multi-layer data package includes a plurality of layers and one or more subpackages in each layer. To decode the data package, an objective function is created based on parameters for identifying data in the data package most relevant to information of interest. Subpackages in one or more layers are evaluated using the objective function and a subpackage is selected. Information for the selected subpackage, which may include a summary and metadata, is used to determine whether the subpackage satisfies an information need. If the information need is not satisfied, a drill down procedure is performed to evaluate subpackages in a next lower layer of the data package.

17 Claims, 13 Drawing Sheets

OTHER PUBLICATIONS

The HDF Group (THG), "HDF5 User's Guide. Release 1.6.6", Internet Citation: <URL: http://www.hdfgroup.org/HDF5/doc1.6/PSandPDF/HDF5_UG_r166.pdf>, p. 246PP; Aug. 1, 2007.

Tolani, et al, "XGrind: A Query-Friendly XML Compressor", Proceedings 18th Int'l Conference on Data Engineering, pp. 225-234; Feb. 26-Mar. 1, 2002.

O'Morain, M. et al. "Onion Routhing for Anonymous Communications" 4BA2 Technology Survey. Found at: http://ntrg.cs.tcd.ie/undergrad/4ba2.05/group10/index.html.

PCT International Search Report RE: PCT Application #PCT/US08/80912. Dated Oct. 23, 2008.

EPC Search Report and Written Opinion, RE: Application #08845183.6. Dated Dec. 13, 2010.

Yang, et al, "An Information Delivery System with Automatic Summarization for Mobile Commerce"; Decision Support Systems, Elsevier Science Publishers, Amsterdam, NL, vol. 43, No. 1, pp. 46-61; Jan. 12, 2007.

Kaplan Noam, et al, "A Functional Hierarchical Organization of the Protein Sequence Space", BMC Bioinformatics, Biomed Central, London, GB, vol. 5, No. 1, p. 196; Dec. 14, 2004.

The HDF Group (THG), "HDF5 Users Guide. Release 1.6.6", Internet Citation, <URL:http://www.hdfgroup.org/HDF5/doc1.6/PSandPDF/HDF5_UG_r166.pdf>, p. 246PP; Aug. 1, 2007.

Fu Lee Wang, et al, "Impact of Document Structure on Hierarchical Summarization", Digital Libraries: Achievements, Challenges and Opportunities Lecture Notes in Computer Science;; LNCS, Springer, Berlin, DE, pp. 459-469; Jan. 1, 2006.

* cited by examiner

500

Making Devices Smarter

Devices have revolutionized communications, not to mention our lives. But they are still going through an evolution of their own. An evolution spawned by the need to provide a better user experience. Today, everything from cell phones to set-top boxes requires the user to learn a unique set of functions and limitations, modes of communication, for example. Most devices can handle text inputs, but are deaf to voice commands. What's more, even the ones that are capable of some voice interactions can understand only the most basic terms, and access to this capability tends to be buried in the graphical user interface (GUI) menu system.

However, when devices and networks are enabled by mature intelligent interaction technologies, they will actually learn an individual's patterns of behavior. They will be aware of the context in which the user attempts to achieve a specific goal or complete a specific task. And they will be able to provide applications and services with the interaction modalities of the specific user's choosing. So, if a user is driving a car and needs to use voice commands, is at home and wants to type a text message, or is in the office and wants to distribute a document by gesturing on his or her device's screen, it's no problem. Or, if a user is a passenger in the car and wants to use GUI-based commands, is at home and wants to dictate a text message, or is in the office and wants to distribute a document addressed to the attendees of a meeting in his phone's calendar, it's no problem either. The device has the intelligence and flexibility to respond. The user's goal, personal context, and learned personal preferences are what will determine the type and extent of interaction.

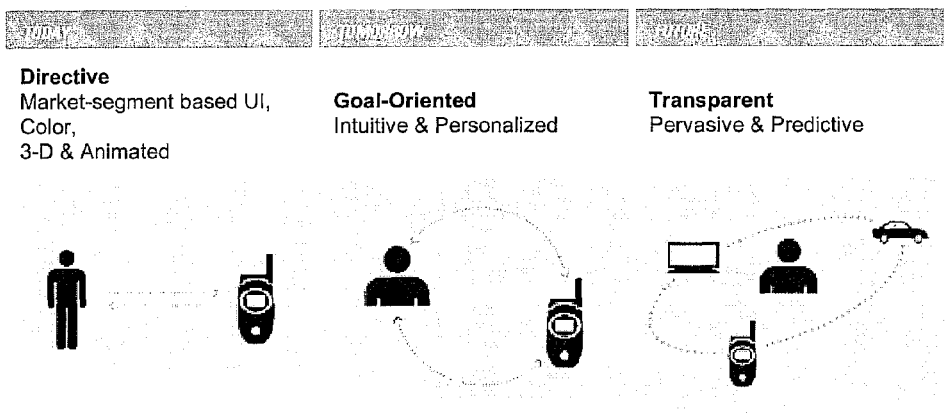

Directive
Market-segment based UI,
Color,
3-D & Animated

Goal-Oriented
Intuitive & Personalized

Transparent
Pervasive & Predictive

Motorola's Approach

Motorola intelligent interaction research includes user-to-device, device-to-device and device-to-network connections, but our key objective is improving the user experience. From that perspective, Motorola has defined six primary attributes of intelligent interaction:

1. Goal-oriented— Users must be able to focus on their objectives at a level that makes sense to them, rather than at a level that requires them to think about how to achieve those objectives. In other words, the device should have the intelligence to interpret the user's instructions in a way that is meaningful.

2. Interactive— Devices must have the intelligence to do what the user wants without calling attention to themselves or creating complexity. They must be able to deal with user input ambiguity and prompt the user for appropriate clarification.
3. Multimodal— The user must have the flexibility to deploy the Input/Output (I/O) modalities that suit his or her purposes and situation.
4. Context Aware— An intelligent device should be able to differentiate between various locations, users, and goals — and operate appropriately (e.g., by vibrating instead of ringing in a theater).
5. User Adaptive— The intelligent device or system can deduce information based on user patterns in order to optimize the behavior of the device at any given time.
6. Pervasive— An intelligent interaction-enabled platform must be able to provide an optimal experience, regardless of the device or the situation in which it is being used. This requires devices to glean knowledge of the user from other connected devices and put this combined knowledge into practice, regardless of the device, context or task.

Motorola engineers are working to build a comprehensive intelligent interaction architecture that crosses devices, software domains and modalities. By design, this architecture will keep technological complexity out of sight and out of mind, while enabling complete freedom of movement between devices and environments. Specific areas of research focus within this architecture include development tools, prototyping and experience design, input interpretation and output generation, interaction management, contextual reasoning, user modeling and goal determination.

Motorola's Human Interaction Research is taking the lead in developing this vital intelligent interaction architecture.

Related Downloads

- White Paper: Intelligent Interaction
- Innovation case study: Fingerwriting

*The source text in this example is 722 words.*

```xml
<dataPackage layer = "2" subpackages = "2">

<!-- Settings from the device environment at the time of encoding are recorded here. -->
<environment>
603    <resource type = "connectivity">good</resource>
       <resource type = "bandwidth">high</rsource>
       <resource type = "HD_memory" units = "Tb">2</resource>

604    <strategy param = "max_compression_ratio">5</strategy>
       <strategy param = "max_layers">3</strategy>
       <strategy param = "archive_method"> Sequential_Compression </strategy>
601 </environment>

<subpackage ID = "1">

605    <encoding param = "segmentation"> topic_cluster_algorithm_4</encoding>
       <encoding param = "aggregation">
       adaptive_sentence_extraction_algorithm_2</encoding>
       <encoding param = "compression"> algorithm_5</encoding>
       <!-- This is ID number of the compressed archive. See below in the XML. -->
       <encoding param = "archive">0</encoding>

<!-- These are keywords describing the primary topic perspective of this
       summary. -->
       <keyword ID = "1"> context</keyword>
       <keyword ID = "2"> aware </keyword>

<summary words = "150">
       They will be aware of the context in which the user attempts to achieve a specific goal or
607    complete a specific task.
       The user's goal, personal context, and learned personal preferences are what will determine
       the type and extent of interaction.
       Context Aware— An intelligent device should be able to differentiate between various
       locations, users, and goals — and operate appropriately (e.g., by vibrating instead of ringing
       in a theater).
       This requires devices to glean knowledge of the user from other connec ted devices and put
       this combined knowledge into practice, regardless of the device, context or task.
       By design, this architecture will keep technological complexity out of sight and out of mind,
       while enabling complete freedom of movement between devices  and environments. Specific
       areas of research focus within this architecture include development tools, prototyping and
       experience design, input interpretation and output generation, interaction management,
       contextual reasoning, user modeling and goal deter mination.

</summary>
```

602 </subpackage>

<subpackage ID = "2">

606
<encoding param = "segmentation"> topic_cluster_algorithm_4</encoding>
<encoding param = "aggregation">
adaptive_sentence_extraction_algorithm_2</encoding>
<encoding param = "compression"> algorithm_2</encoding>
<!-- This is ID number of the compressed archive. See below in the XML. -->
<encoding param = "archive">0</encoding>

<keyword ID = "1"> device </keyword>

608 <summary words = "167">
Devices have revolutionized communications, not to mention our lives.
when devices and networks are enabled by mature intelligent interaction technologies, they
will actually learn an individual's patterns of behavior.
The device has the intelligence and flexibility to respond.
Motorola intelligent interaction research includes us er-to-device, device-to-device and device-
to-network connections, but our key objective is improving the user experience.
Devices must have the intelligence to do what the user wants without calling attention to
themselves or creating complexity.
An intelligent device should be able to differentiate between various locations, users, and
goals
The intelligent device or system can deduce information based on user patterns in order to
optimize the behavior of the device at any given time.
An intelligent interaction-enabled platform must be able to provide an optimal experience,
regardless of the device or the situation in which it is being used. This requires devices to
glean knowledge of the user from other connected devices and put this combined knowledge
into practice, regardless of the device, context or task.
</summary>

</subpackage>

610
<!-- Compressed data are stored here -->
<archive ID = "0" encode_time = "23" encode_size = "456" default_decoder = "algorithm_12482" estimated_decode_time = "6">
<!-- Archive 0 includes a compressed version of the entire collection of source data. -->

609
Jkfd890342978jhb24376ds6t7fdsabhj42jk432890fdvljkfds7 -08kjn423
Kjld908245lkfd80-kh54796fdhk89-324243jh5365jh56ljk54jk54jjhjk65
4123098542789043908743kj43890df087-54jh43908fdnjk4590843908
459085nkj5680gfj45980dfjlk890539ygyfdlkj4390854jlk56098gf89054
</archive>

</dataPackage>

```xml
<dataPackage layer = "3" subpackages = "5">

<!-- Settings from the device environment at the time of encoding are recorded here. -->
<environment>
    <resource type = "connectivity">good</resource>
    <resource type = "bandwidth">high</rsource>
    <resource type = "HD_memory" units = "Tb">2</resource>

<strategy param = "max_compression_ratio">5</strategy>
    <strategy param = "max_layers">3</strategy>
    <strategy param = "archive_method"> Sequential_Compression </strategy>
</environment>

<subpackage ID = "3">
    <encoding param = "segmentation"> topic_cluster_algorithm_4</encoding>
    <encoding param = "aggregation">
    adaptive_sentence_extraction_algorithm_2</encoding>
    <encoding param = "compression"> algorithm_5</encoding>
    <!-- This is ID number of the compressed archive. See below in the XML. -->
    <encoding param = "archive">1</encoding>

<keyword ID= "1"> context</keyword>
    <keyword ID= "2"> aware </keyword>
    <keyword ID= "3"> intelligent </keyword>

<summary words = "28">
    Context Aware— An intelligent device should be able to differentiate between various
    locations, users, and goals — and operate appropriately (e.g., by vibrating instead of ringing
    in a theater).

</summary>
</subpackage>

<subpackage ID = "4">
    <encoding param = "segmentation"> topic_cluster_algorithm_4</encoding>
    <encoding param = "aggregation">
    adaptive_sentence_extraction_algorithm_2</encoding>
    <encoding param = "compression"> algorithm_2</encoding>
    <!-- This is ID number of the compressed archive. See below in the XML. -->
    <encoding param = "archive">1</encoding>

<keyword ID= "1"> context</keyword>
    <keyword ID= "2"> aware </keyword>
    <Keyword ID= "3"> knowledge </keyword>
```

*FIG. 7A*

```
710    <summary words = "27">
       This requires devices to glean knowledge of the user from other connected devices and put
       this combined knowledge into practice, regardless of the device, context or task.

</summary>

705    </subpackage>
       <subpackage ID = "5">
           <encoding param = "segmentation"> topic_cluster_algorithm_4</encoding>
           <encoding param = "aggregation">
708        adaptive_sentence_extraction_algorithm_2</encoding>
           <encoding param = "compression"> algorithm_2</encoding>
           <!-- This is ID number of the compressed archive. Se e below in the XML. -->
           <encoding param = "archive">2</encoding>

<keyword ID= "1"> device </keyword>
           <keyword ID= "2"> intelligent </keyword>
           <keyword ID= "3"> interaction </keyword>
711
           <summary words = "19">
           Motorola intelligent interaction research i ncludes user-to-device, device-to-device and device-
           to-network connections, but our key objective is improving the user experience.

</summary>

</subpackage>

<!-- Compressed data are stored here -->
       <archive ID = "0" encode_time = "23" encode_size = "45 6" default_decoder =
       "algorithm_12482" estimated_decode_time = "6">
           <!-- Archive 0 includes a compressed version of the entire collection of source
           data. -->
712
           Jkfd890342978jhb24376ds6t7fdsabhj42jk432890fdvljkfds7 -08kjn423
           Kjld908245lkfd80-kh54796fdhk89-324243jh5365jh56ljk54jk54jjhjk65
           4123098542789043908743kj43890df087 -54jh43908fdnjk4590843908
           459085nkj5680gfj45980dfjlk890539ygyfdlkj4390854jlk56098gf89054
       </archive>
```

\<archive ID = "1" encode_time = "11" encode_size = "56" default_decoder = "algorithm_12482" estimated_decode_time = "3"\>
    \<!-- Archive 1 includes a compressed version of the XML data for Subpackage 1. --\>

713 → 2478540945bk54b8-947984f945732jno1nkl54h9-78597549u854n43980549854
890548943njnkjgfiuopf9d8980j3k54980gf80jkrlkj89009585jklg908kjre5409fdi
879528743908njk54nm435379587879gfdhjhk4897834jhfd890jk890
88890jfd908809sfdj87943907ihfd879hfhsfdjhfdssdfapuu0i4328 -039

\</archive\>

\<archive ID = "2" encode_time = "10" encode_size = "58" default_decoder = "algorithm_12482" estimated_decode_time = "3"\>
    \<!-- Archive 2 includes a compressed version of the XML data for Subpackage 2. --\>

714 → 4231-8432jn24890fvd908ljhfdsipuofds8fd90824905421joi5480 —254joifdjk;
8707509431khvdslkfa78-87-jho43870-fdjklfsda80927-05429082oiod908fdsa
875427854b43bnk9870ds90889un54-9b874f945ouni54fnj07h097h90854jk43
87954879541hk897fda439h89438hnfdsihgahk5890547 -985498u0kjnfd980rew \</archive\>

\</dataPackage\>

FIG. 7C

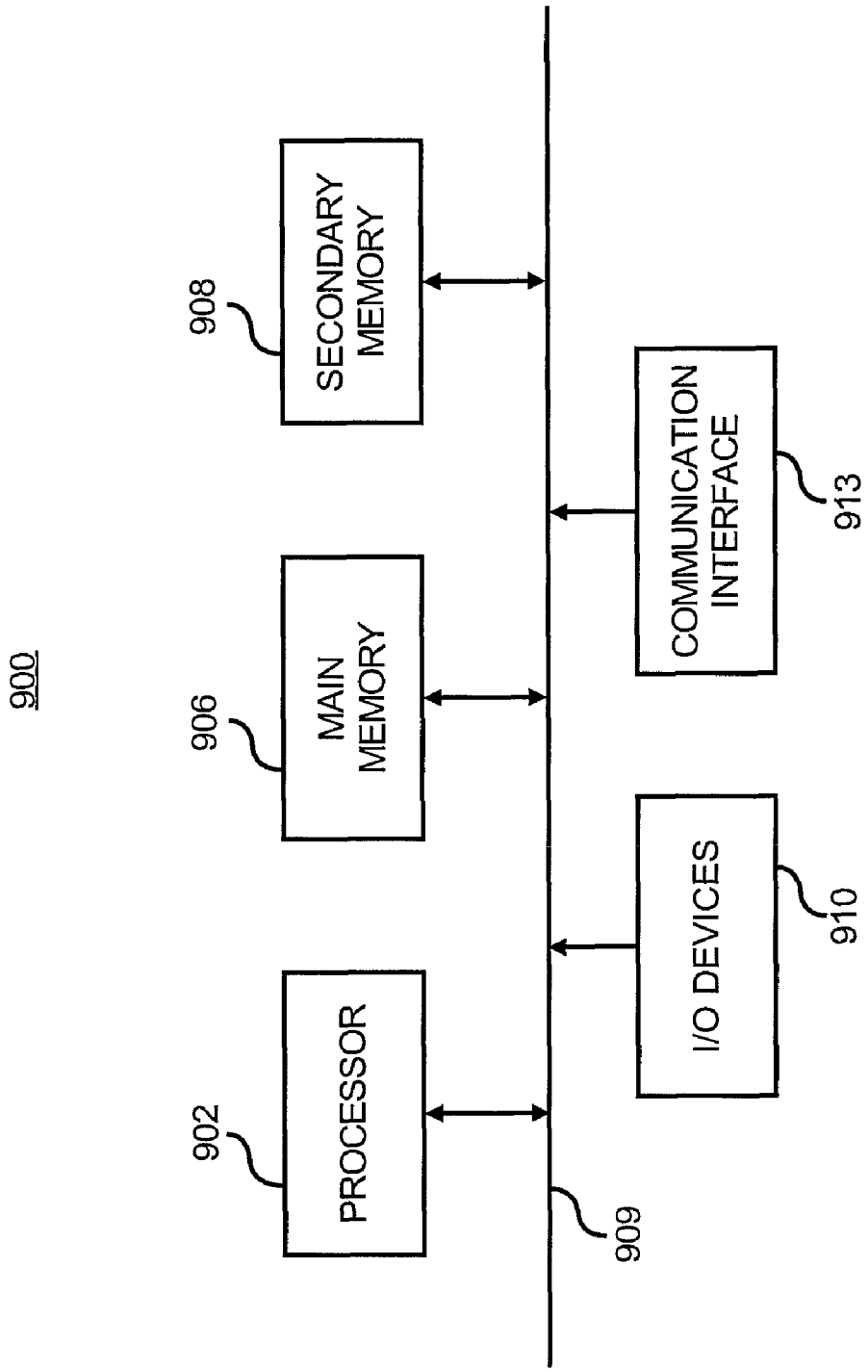

DECODING A HIERARCHICAL MULTI-LAYER DATA PACKAGE

CROSS-REFERENCE TO RELATED APPLICATION

This patent application is related to U.S. patent application Ser. No. 11/929,623, entitled "Encoding a Hierarchical Multi-Layer Data Package" by Tirpak, which is incorporated by reference in its entirety.

BACKGROUND

Given current advances in network technology, high-bandwidth networks that allow large amounts of data to be transmitted to a destination are becoming more pervasive. These networks even include wireless networks or wireless access networks that allow transmission bursts of a large amount of data to a destination in a short period of time.

Given a high-bandwidth network, the problem is not so much how to quickly and efficiently transmit a large amount of data to a destination. Instead, situations may arise where a device receives a large amount of data in a short period of time, but due to the size of the data, the device cannot quickly and efficiently identify particular data of interest in the received data.

For example, in an emergency situation, emergency personnel receive a 200 GB data dump of medical records over a network for multiple injured people. If the receiving device is in the field, the device may not have the processing power or memory to quickly and efficiently identify vital information for an injured person from the 200 GBs of medical records. In another example, a real estate agent representing a buyer may download housing information meeting certain criteria for the buyer. However, because the information is organized from a seller's perspective, the real estate agent may miss certain listings or is unable to quickly identify information for the buyer. Thus, in these and other situations, due to the size and possibly the lack of organization of the transmitted data, the data are less usable to the receiving device and may, in some situations, be unusable, depending on the computing resources of the receiving device.

BRIEF DESCRIPTION OF THE DRAWINGS

Embodiments are illustrated by way of example and not limited in the following Figure(s), in which like numerals indicate like elements, in which:

FIGS. 5A-B illustrate a text document example of data to be coded, according to an embodiment;

FIGS. 6A-B and 7A-C illustrate an example of encoding the text document, according to an embodiment;

FIG. 9 illustrates a computer system, according to an embodiment.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the description of the embodiments.

According to an embodiment, a hierarchical multi-layer data package is encoded. The hierarchical multi-layer data package, also referred to as data package, is comprised of a plurality of layers arranged in a hierarchy. Each layer includes one or more subpackages of data comprising summaries and metadata that allows a device to quickly identify information of interest in a layer, i.e., "skim" and determine whether to decode data in the layer or whether to "drill down" to a lower layer to identify data of interest. Thus, decoding the data package comprises evaluating summaries and metadata in subpackages in a layer and determining whether to drill down to related subpackages in lower layers or decompress information in a current layer.

Figure 1:
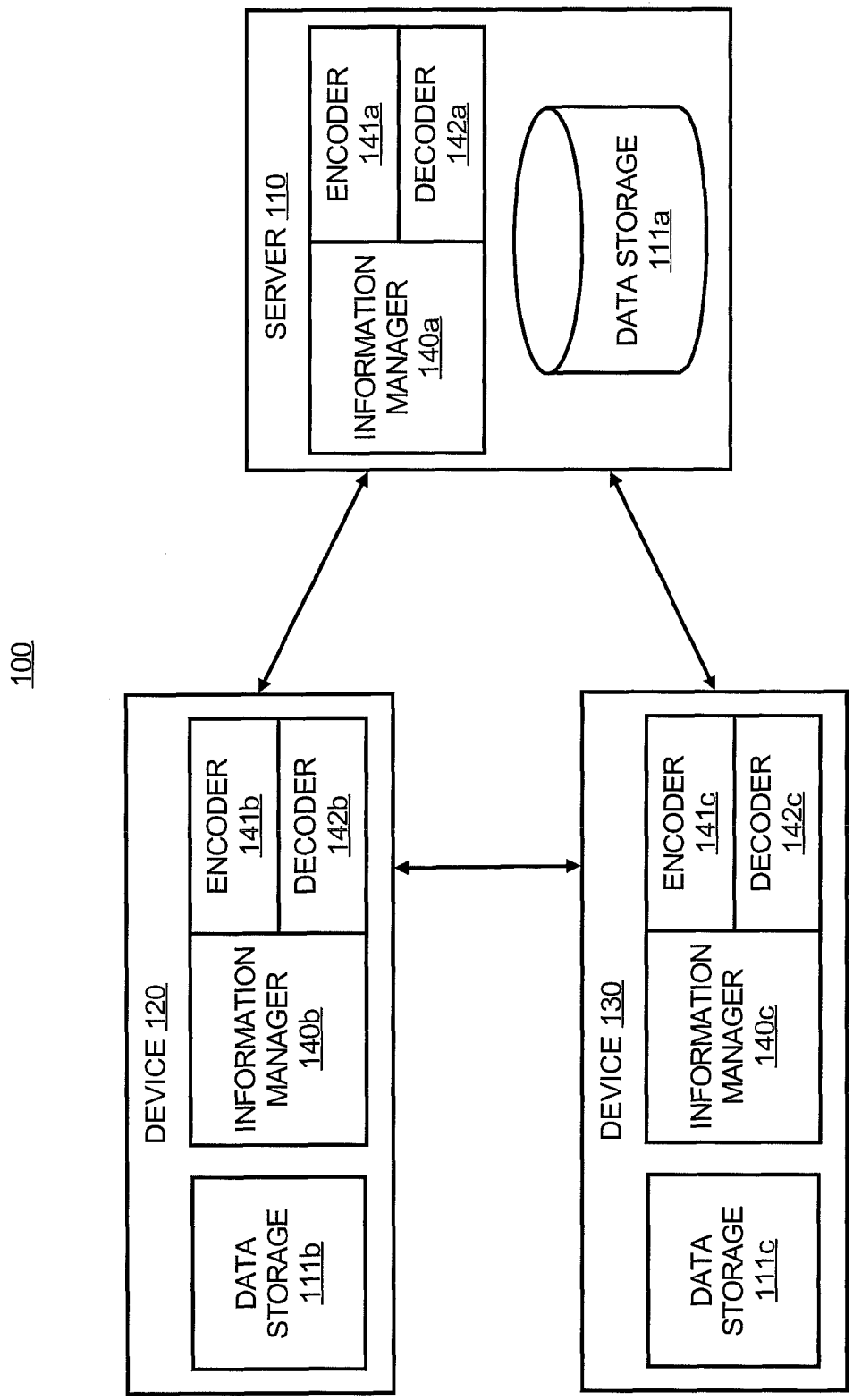
FIG. 1 illustrates a system, according to an embodiment.

FIG. 1 illustrates a system 100 operable to code a hierarchical multi-layer data package. Coding includes encoding and decoding. FIG. 1 illustrates a server 110, a device 120 and a device 130. The server 110 and the devices 120 and 130 each include an information manager 140, an encoder 141, a decoder 142 and data storage 111, which are shown as 140a-c, 141a-c, 142a-c, and 11a-c, respectively.

The devices 120 and 130 may include devices that are operable to communicate with other devices via a network or via a peer-to-peer connection. For example, the devices 120 and 130 may communicate with the server 110 via a client-server arrangement over a network, and the devices 120 and 130 may communicate with each other using a peer-to-peer protocol. Examples of the devices 120 and 130 may include a personal digital assistant, laptop, desktop, set top box, a vehicle including a computer system or substantially any device or apparatus including a computer system operable to perform the functions of the embodiments described herein. Communication between the devices 120 and 130 and the server 110 may include wired and/or wireless connections.

FIG. 1 shows the server 110 and the devices 120 and 130 to illustrate that the coding embodiments may be employed in different types of devices and in different types of networks. It will be apparent to one of ordinary skill in the art that the coding embodiments may be provided in other types of systems. Furthermore, in one embodiment, an external data storage operating as a data repository may be used for storing data for the devices 120 and 130 or the server 140. In this embodiment, the data repository does not include an information manager or an encoder or decoder. The devices 120 and 130 may also store information locally.

The information manager 140 provides information to the encoder 141 to encode data for transmission to another device and also provides information to the decoder 142 to decode received data. For example, the information manager 140 maintains a list of topics of interest for the device. It also identifies the level of detail that is desired for each of these topics, e.g., "executive briefing", 500 word summary, white paper, all available raw data, etc. The information manager 140 also maintains current information about the state of computing resources, e.g., the processor utilization, the free memory space, etc. Using this information, the information manager 140 makes coding decisions. For example, the information manager 140 provides the encoder 141 with a compression ratio that represents the best trade-off between data package size and ease of use. One embodiment generates such advice based not only on the current computing resource measurements for the device, but also on future resource usage predictions for the device and other devices in its network.

The information manager 140 determines the hierarchical compression strategy for encoding the data. This may includes the compression ratio, the maximum number of subpackages of data for a given layer in a data package and other metadata. The maximum number of subpackages may be a function of the number of statistically significant/different data clusters, as well as the status of available computing resources and the "operations goal" of the network of devices which share data packages. The "operations goal" may be based on the attributes of the computing resources for the anticipated set of devices which will transmit and/or use the data package. For example, portable devices with less memory and processing power may set goals that best utilize their computing resources. In general, more clusters will use more sub-packages, thereby increasing the specificity of the data in the sub-package.

The information manager 140 also determines the maximum and target number of layers in the data package. This is a function of the overall size of the data package, as well as the status of available computing resources and the "operations goal" of the network of devices which share data packages. In general, larger data packages may use more layers, thereby reducing the amount of data that needs to be scanned at the top layer. Higher compression rates and computational efficiencies can be obtained with larger data packages. Therefore, in on embodiment, the largest data sub-packages possible are used at each level in the hierarchy. This is consistent with the "burst" (transmission) and "skim" (search) approach.

Figure 2:
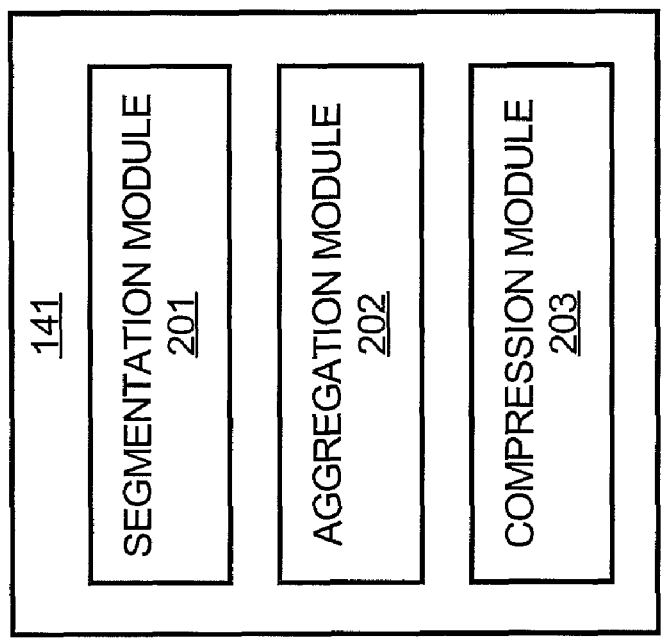
FIG. 2 illustrates a hierarchical encoder, according to an embodiment.

The encoder 141 is a hierarchical encoder. Modules in the encoder 141 are shown in FIG. 2. Modules include software performing certain functions. However, it will be apparent to one of ordinary skill in the art that the encoder 141 may be embodied in hardware, software or a combination of hardware and software.

The encoder 141, according to an embodiment, includes a segmentation module 201, an aggregation module 202 and a compression module 203. The segmentation module 201 applies a segmentation algorithm, which may be selected by the information manager 140, to data previously selected to be encoded. The segmentation module 201 generates clusters of data, and keywords and/or other identifiers are established for each cluster.

The aggregation module 202 applies an aggregation algorithm, which may be selected by the information manager 140, to the clusters to generate summaries for the clusters. Summaries may be provided in XML. The layer of the data package is updated to include the summaries.

The compression module 203 applies a hierarchical compression strategy determined by the information manager 140. The compression module 203 may apply a compression algorithm selected by the information manager 140. Also, the compression module 203 may apply an archiving method selected by the information manager 140. The archiving method employs the compression algorithm to compress data at different layers of the data package.

One example of an archiving method is a sequential method. In the sequential method raw source data is archived at layer 1; the subpackages at layer 1 are archived at layer 2; the subpackages at layer 2 are archived at layer 3; etc. If minimizing the data package size is important, a sequential compressed method may be applied that compresses the summaries at the current level and stores them in the archive section of the data package. Only the keywords and other metadata are provided in the data package as uncompressed. Another archiving method for minimizing the data package is the differential method. In the differential method differences between the raw source data and summaries at layer 1 are archived at layer 1, differences between summaries at layer 1 and summaries at layer 2 are archived at layer 2, differences between summaries at layer 1 and summaries at layer 2 are archived at layer 2, etc. The encoder 141 also records relevant compute-time statistics which can assist in the selection of summaries and real-time decoding of archives in the future.

Figure 3:
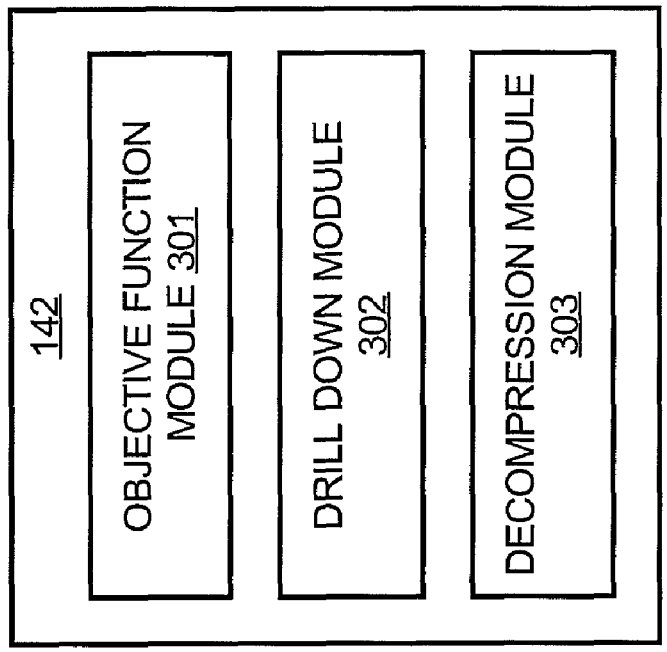
FIG. 3 illustrates a hierarchical decoder, according to an embodiment.

The decoder 142 is a hierarchical decoder. According to an embodiment, the decoder 142 includes an objective function module 301, a drill-down module 302 and a decompression module 303, as shown in FIG. 3. The objective function module 301 uses an objective function to quantify the trade-offs associated with "goodness of fit" of the retrieved data, decompression time, and other applicable parameters of the data package, to guide the selection of a sequence of traversing the data package. The output of the objective function module 301, e.g., a score, may be used by the drill-down module 302 to determine whether to parse metadata and summaries for a lower layer in the hierarchy of the data package or use the data from a current a layer. The decompression module 303 decompresses the subpackage or subpackages of interest at the selected layer.

In one embodiment, the information manager 140 receives a summary and metadata, such as encoding/decoding statistics (e.g., decompression time), for a subpackage selected using the objective function. The information manager 140 determines whether the summary and metadata satisfies the information need. For example, the information manager 140 may use classifiers, statistical processing or other techniques to evaluate how close a summary matches information of interest. Also, the information manager 140 may consider decompression time and device attributes. Also, user input may be used to determine whether the subpackage is sufficient for a request or if another subpackage should be selected. If the subpackage is determined to be sufficient, the information manager 140 sends a request to the decoder 142 to decompress the data for the subpackage. Otherwise, the information manager 140 sends a request to the decoder 142 to select another subpackage. For example, the drill down module 302 selects another subpackage in a lower layer.

It should be noted that depending on the archiving method, it may or may not be necessary for the information manager 140 to send a request to the decoder 142 to decompress the data for the subpackage if the subpackage is determined to be sufficient. In the plain sequential archiving method, the summary for the subpackage is compressed along with the subpackage. Thus, when the sequential method is used, the entire subpackage may be decompressed to access the summary. If the subpackage is determined to be sufficient, then there is no additional need to decompress the data for the subpackage. Instead, the data for the subpackage was already decompressed with the summary. For the sequential compressed and the differential archiving methods, the data for the subpackage needs to be decompressed if the subpackage is determined to be sufficient from the summary and/or meta data.

In another embodiment, the decoder 142 decompresses the data for the selected subpackage and sends it to the information manager 140 for evaluation. Using the decompressed data, the information manager 140 determines whether the information is sufficient or if data for another subpackage is needed.

Figure 4:
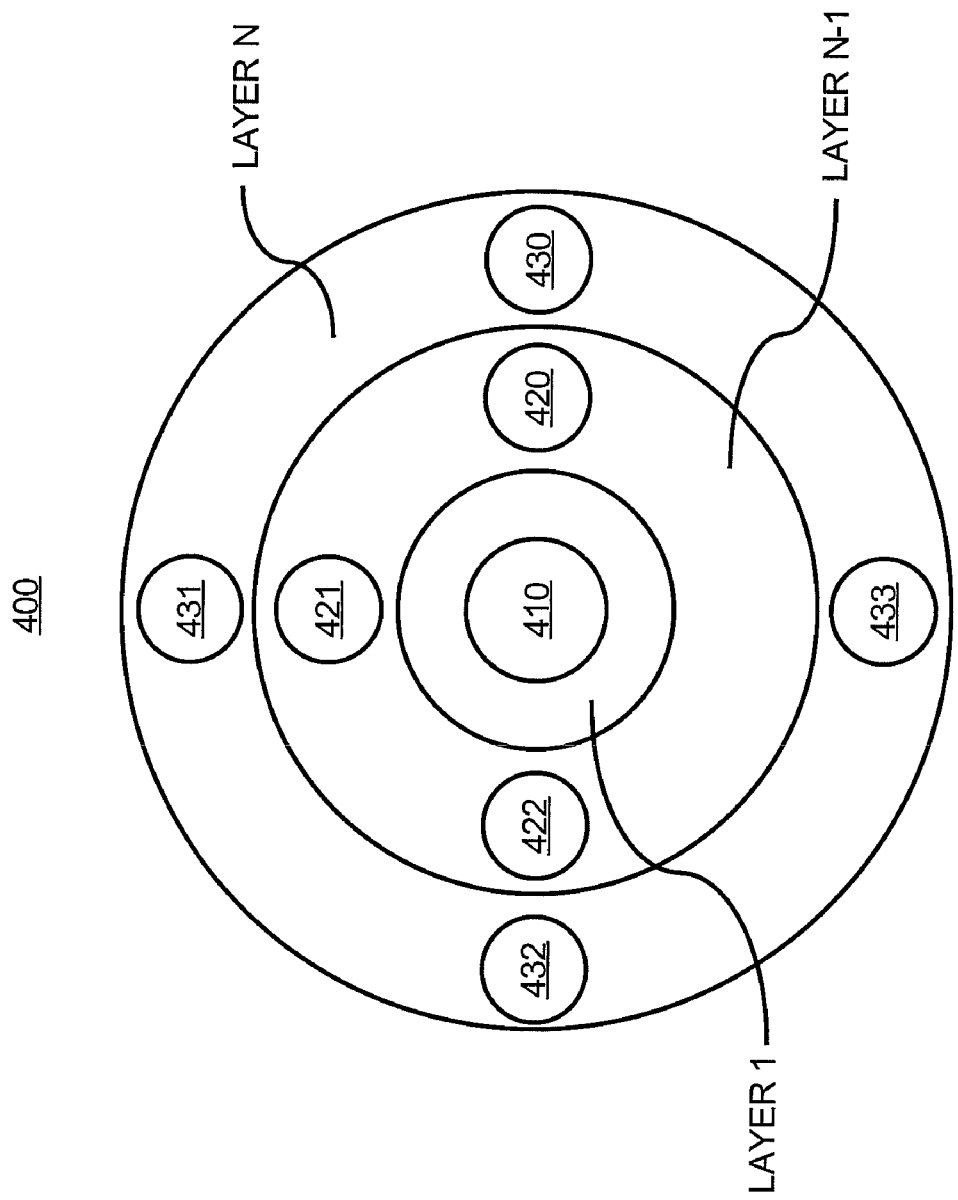
FIG. 4 illustrates a hierarchical multi-layer data package, according to an embodiment.

FIG. 4 illustrates a multi-layer hierarchical data package 400, according to an embodiment. The data package includes multiple layers shown as layers 1 through N. Each layer is comprised of one or more subpackages. For example, layer N has subpackages 430-433; layer N-1 has subpackages 420-422; and layer 1 has subpackage 410. The number of subpackages shown in each layer is provided by way of example and not limitation, and the number of subpackages in each layer may be different for different data packages.

When decoding, if the information manager 140 determines that the subpackage 430 is relevant but more information is needed, the decoder 142 drills down to a lower layer. For example, the subpackage 420 is related to the subpackage 430 and the metadata and summary for the subpackage 430 is parsed to determine whether that subpackage contains data of interest for the user. If so, the data is decompressed. Metadata for each subpackage may identify related subpackages in higher or lower levels in the hierarchy to allow for efficiently identifying a related subpackage in another layer for drill down.

FIGS. 5A-B illustrates an example of data that may be encoded to form a multi-layer hierarchical data package. In this example, the data is a text document 500. However, it will be apparent to one of ordinary skill in the art that any type of data, e.g., video, audio, raw data, etc., may be encoded to form a multi-layer hierarchical data package as described in the embodiments herein.

FIGS. 6A-B and 7A-C illustrate code representing at least some of the information in layers in a multi-layer hierarchical data package including 3 layers, according to an embodiment. FIGS. 6A-B and 7A-C illustrate the types of information and examples of information in the data package. It should be noted that data packages can have more or less layers with different numbers of subpackages and different information.

The data package shown in FIGS. 6A-B and 7A-C is comprised of data encoded from the text document 500 shown in FIGS. 5A-B. The data package includes 3 layers. Layer 3 is the outermost layer that would be parsed first by the decoder 142. Layer 3 represents a layer created from 3 cycles of compression. Layer 3 includes the most focused subpackages. Layer 2 is an intermediate layer. Layer 2 has fewer subpackages having more content and more general content. Layer 1 is not shown, but is the inner most layer of the data package and includes the most content and has the broadest scope, e.g., a representation of the original complete data.

In the data package shown in FIGS. 6A-B and 7A-C, the information manager 140 has established a target of 5 to 1 compression for each of the layers, and a maximum of 3 subpackages for each layer. FIGS. 6A-B show the intermediate layer 2 in the data package, which is labeled 600. There are 2 subpackages for layer 2 having subpackage IDs of 1 and 2 and shown as 601 and 602. Each layer also has metadata. Metadata for layer 2 is shown as 603 and 604. Metadata 603 may include attributes about the computing resources for the device, connectivity, bandwidth, etc. Metadata 603 provides information about the hierarchical compression strategy for the layer and data package. Metadata 603 may include the maximum compression ratio, the maximum number of subpackages per layer, the archival method, etc.

The subpackages also include metadata. Metadata 605 and 606 are shown for the subpackages 1 and 2 respectively, and includes information regarding the segmentation, aggregation and compression used. For example, segmentation includes the identification of sections of the overall data set that relate to specific themes or topic clusters. A number of algorithms may be used to perform such clustering. For a data example, segmentation can be accomplished by applying a data mining method, e.g., rule induction, classification based on association (CBA), etc. The metadata for segmentation may identify the clustering algorithm used to create the clusters.

Aggregation creates the summaries for the subpackages. In this example, the aggregation creates text summaries for the source document shown in FIGS. 5A-B6. The summaries correspond to the clusters, which may be topics of interest, identified in the segmentation. The metadata for aggregation may identify the aggregation method used to create the summaries, such as a sentence extraction method. For a data example not including text, aggregation may be accomplished by creating statistical summaries of data at a given level of stratification, i.e., including one or more segments of the data. Alternatively, data may be aggregated by generating explicit numerical relations that summarize a set of data, e.g., by using gene expression programming (GEP), such as described in U.S. Pat. No. 7,127,436, entitled "Gene Expression Programming Algorithm", assigned to Motorola, Inc., which is incorporated by reference in its entirety. For raw data the summary may be a best fit equation or a collection of compressed views into data. For a time series, the summary may be a timeline trend that is sampled less frequently then the raw data or the summary only shows data when there are significant changes.

The metadata may also identify the compression algorithm for compressing the document. Compression algorithms generally apply to any set of binary data. However, the information manager 140 may select a compression algorithm that is specifically tuned for good performance with certain types of data, e.g., text-only, JPEG image set, etc.

The metadata also includes an ID or a link to the compressed data. For example, if the information manager 140 determines that the subpackage includes data of interest to the user, the link, shown as <encoding param="archive">0</encoding>, is used to find and retrieve the compressed data from the data package.

The metadata also includes one or more keywords describing the cluster, which is the topic of interest in this example. For example, the cluster for subpackage 1 is described by the keywords "context" and "aware".

The subpackages 1 and 2 include summaries 607 and 608 respectively. The summaries are created through the aggregation process. The summaries help identify whether the data for the subpackage is sufficient for the user or whether to select another subpackage or drill down to another layer. Note that the summaries include text from the source document in FIGS. 5A-B that is related to the topic of interest, which represents the cluster described by the keyword(s) for the subpackage.

The compressed data for layer 2 is shown as 609 in FIG. 6B. Because the sequential archival method was used, layer 2 includes compressed data for lower-level layer 1. Metadata 610 for the compressed data may include information for coding the data. This information may be used by the information manager 140 to make coding decisions.

FIGS. 7A-C illustrate layer 3 in the data package. Layer 3 includes 3 subpackages, shown as subpackages 3-5 and labeled as 701-703. Layer 3 and the subpackages 305 include metadata similar to the metadata described above for layer 2. Layer 3 includes metadata 704 and 705. The subpackages 3-5 include metadata 706-708 and summaries 709-711. Note that the keywords for subpackages 3 and 4 include the keywords for subpackage 1. Also, each of the subpackages 3 and 4 includes an additional keyword. Thus, subpackages 3 and 4 are related to subpackage 1 in the hierarchy, but provide an additional level of detail as to the data in the data package. During decoding, if the information manager 140 determines subpackage 3 is relevant, the information manager 140 may decide to drill down to subpackage 1 if more information is needed. Similarly, subpackage 5 in layer 3 is related to subpackage 2 in layer 2. FIG. 7C shows as 710 and 711 the compressed data for each subpackage in layer 3 along with associated metadata.

Layer 3 also includes compressed data 712-714. Because the sequential archival method was used, layer 3 includes compressed data for lower-level layers 1 and 2. Other archival methods may store compressed data for the layer with the layer.

Figure 8A:
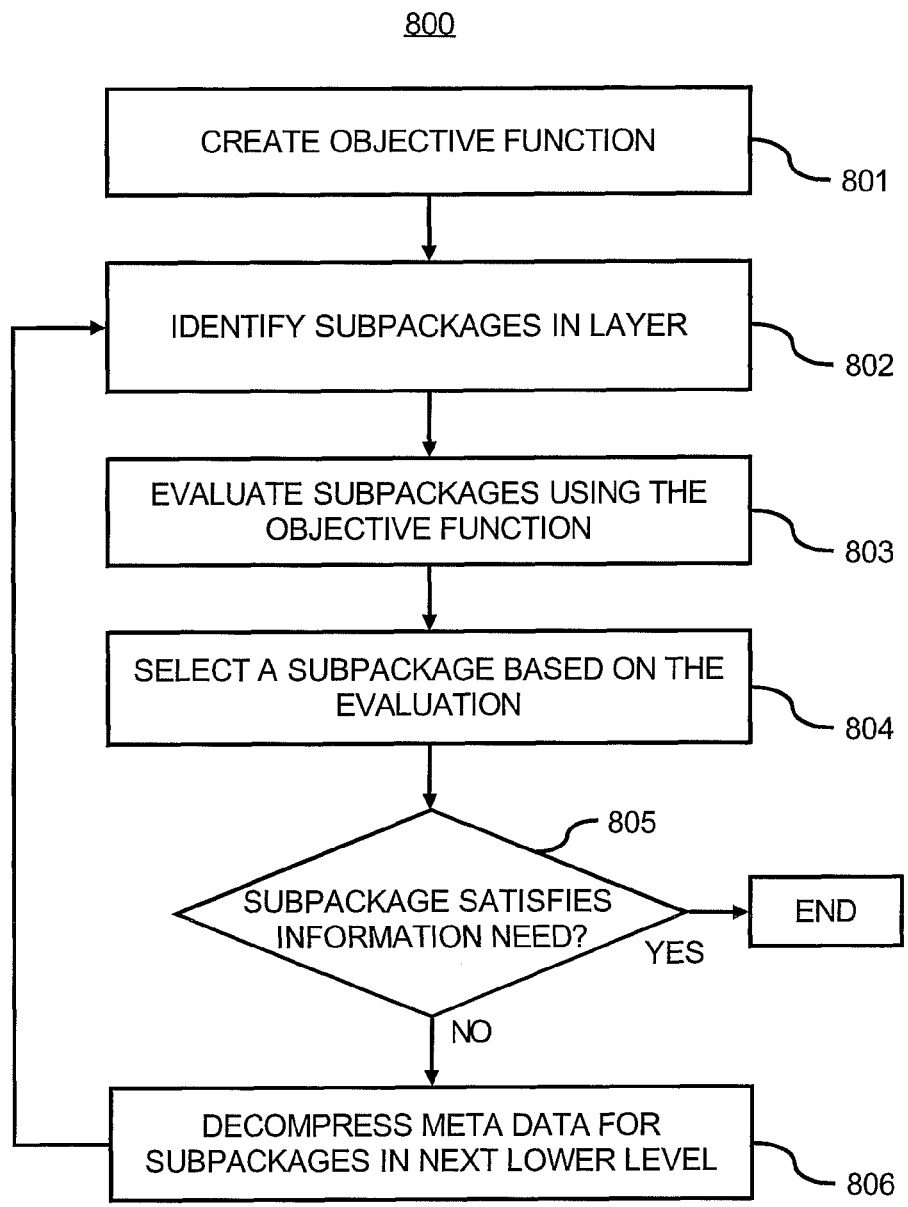
FIGS. 8A-B illustrate flow charts of methods for decoding data, according to embodiments.
Figure 8B:
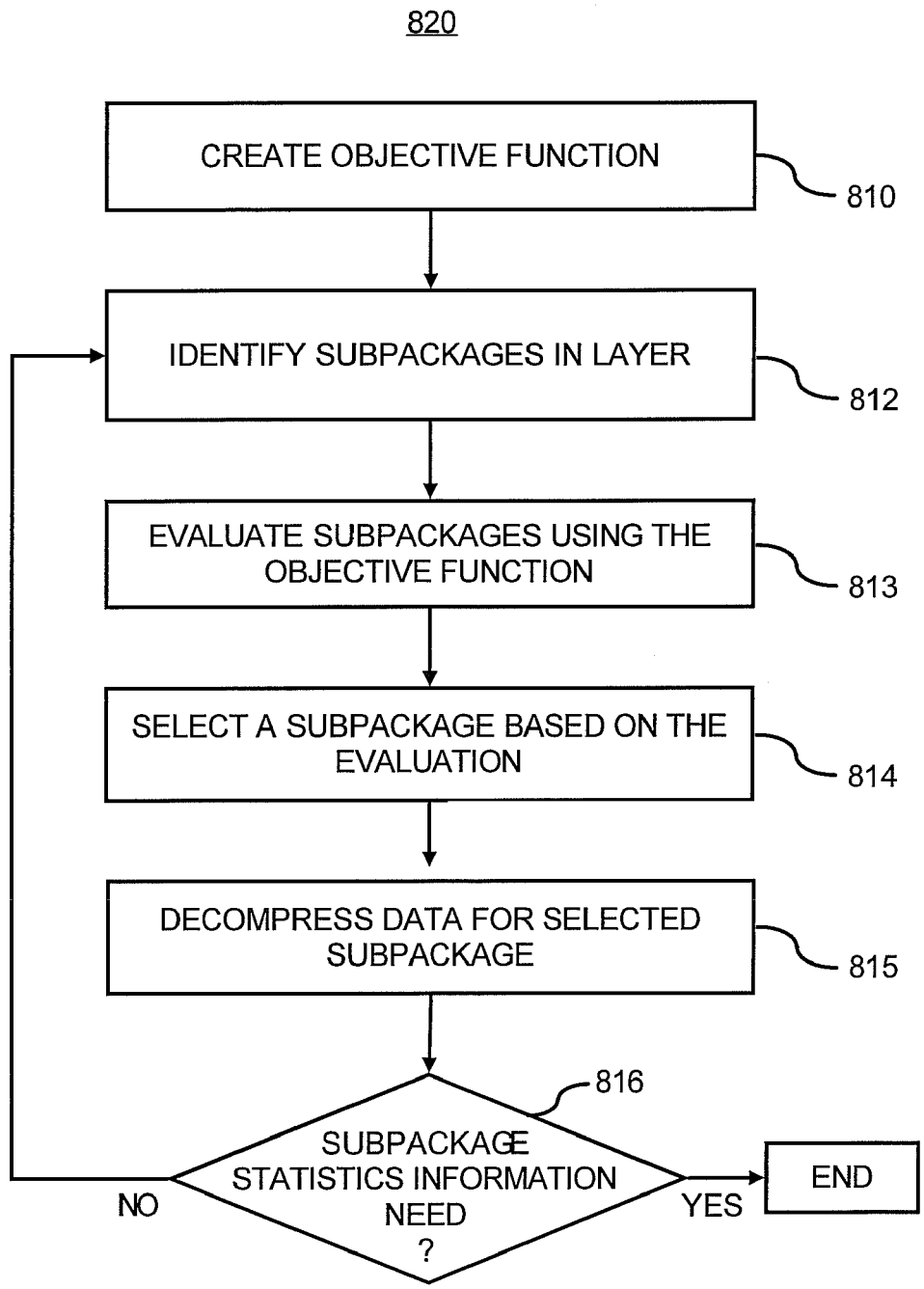

FIGS. 8A and 8B illustrate methods for decoding a multi-layer hierarchical data package, according to embodiments. Different decoding methods may be applied for different archiving methods. The metadata at the outermost layer of the data package includes a tag or other information specifying which archiving method was used, such as sequential, sequential compressed, and differential. Alternatively, information specifies the subset of the source data that is compressed at each layer, and whether or not the metadata are also compressed, or if the metadata are maintained uncompressed, such as in the form of XML text. In this way, it is clear which decoding method needs to be used. The source data referred to above is the data for the entire data package, and a subset of the source data corresponds to each subpackage. The entire source data may be compressed at a lowest level of the data package for some archiving methods.

FIG. 8A describes a decoding method 800 when the sequential archiving method was used to encode the data package. FIG. 8A is described with respect to one or more of FIGS. 1-7C by way of example and not limitation. It will be apparent to one of ordinary skill in the art that the method 800 may be practiced in other systems.

At step 801, an objective function is created for evaluating subpackages in the data package. For example, based on the topics of interest and available computing resources, such as monitored by the information manager 140, the decoder 142 creates an objective function to quantify the trade-offs associated with goodness of fit of the retrieved data (e.g., based on keyword matches), decompression time, and other applicable parameters of the data package, to guide the selection of a sequence of traversing subpackages and layers in the data package.

In general, an objective function is the function to be optimized to solve a problem. For example, the objective function for decoding a data package characterizes the problem of identifying the most relevant data for a search while minimizing the amount of information that needs to be decompressed to find that data. The goal is to minimize search time to find the most relevant information in the data package to interest area that can be accessed quickly.

In one example, if you are a seller of a townhome and the data package comprises listings for properties on the market. The data package may include subpackages for sellers, subpackages for buyers and subpackages for different types of devices that may be decoding the data based on the device attributes. If the objective function is goodness of fit, then the objective function may select a subpackage for sellers of townhomes in a particular price range and designed for decoding by a mobile phone if the user is using a mobile phone. Metadata in a subpackage may include device attributes and estimated decoding time, which can be used, along with a summary, to select a subpackage.

At step 802, information in a layer is parsed to identify subpackages and their summaries and metadata. For example, the decoder 142 parses the layer, and identifies the subpackages, their respective keywords, and metadata such as the anticipated decompression times for the summaries.

At step 803, the subpackages are evaluated using the objective function. For example, the objective function may be a scoring function that generates a score for each subpackage. If the objective function utilizes goodness of fit, this may include how well a subpackage matches a search request, which may include keyword search terms (e.g., townhome, price range, seller) and device attributes for a device decoding the data package, in order to satisfy a specific information need.

At step 804, a subpackage is selected based on the evaluation. For example, the decoder 142 selects a subpackage in the current layer, which may initially be the outer most layer in the data package, that receives the highest score from the objective function.

At step 805, a determination is made as to whether the subpackage satisfies the information need. For example, the decoder 142 decompresses the summary and subset of source data for the subpackage and sends the (uncompressed) summary to the information manager 140, and the information manager 140 determines if the information need has been satisfied. Other information may also be sent to the information manager 140 for the determination, such as the metadata for the subpackage. If the information manager 140 determines the information need has been satisfied, then the method is completed. The information manager 140, for example, receives the decompressed subset of source data for the subpackage which was decompressed with the summary. Thus, the subset of source data is provided to the information manager 140 and to the user.

If the information need is not satisfied, then the information manager 140 sends a request for more information to the decoder 142. The decoder 142 performs a drill down procedure at step 806 and repeats steps 802-805 again. The drill down procedure may include decompressing metadata for any subpackages in a lower level at step 806. Then, repeating steps 802-805 for subpackages in the next lower layer.

If the lowest layer in the data package has been reached and the information need has not been satisfied, then the method may be ended and one or more of any previously selected subpackages may be selected. The data for these subpackages is decompressed and provided to the user. In another embodiment, a new objective function is created, and the method is repeated. The new objective function may consider broader search terms or other parameters. Alternatively, the entire data package is decompressed and presented or made available to the user. It should be noted that in many instances, when drilling down to a lower layer, the same objective function is used. However, for real-time applications, an update to the objective function may be performed, for example, to reflect available computational resources at the decoding device even if the lowest layer has not been reached.

FIG. 8B describes decoding method 820 when the sequential compressed or the differential archiving method was used to encode the data package. FIG. 8B is described with respect to one or more of FIGS. 1-7C by way of example and not limitation. It will be apparent to one of ordinary skill in the art that the method 800 may be practiced in other systems.

At step 811, an objective function is created for evaluating subpackages in the data package. For example, based on the topics of interest and available computing resources, such as monitored by the information manager 140, the decoder 142 creates an objective function to quantify the trade-offs associated with goodness of fit of the retrieved data (e.g., based on keyword matches), decompression time, and other applicable parameters of the data package, to guide the selection of a sequence of traversing subpackages and layers in the data package.

At step 812, information in a layer is parsed to identify subpackages and their summaries and metadata. For example, the decoder 142 parses the layer, and identifies the subpackages at the current layer. For the sequential compressed archiving method some metadata, such as keywords and other metadata are already uncompressed in the received data package. If the metadata is compressed, the metadata may be decompressed for the evaluation at step 813.

At step 813, the subpackages are evaluated using the objective function. For example, the objective function may be a scoring function that generates a score for each subpackage. If the objective function utilizes goodness of fit, this may include how well a subpackage matches a search request, which may include keyword search terms (e.g., townhome, price range, seller) and device attributes for a device decoding the data package, in order to satisfy a specific information need.

At step 814, a subpackage is selected based on the evaluation. For example, the decoder 142 selects a subpackage in the current layer, which may initially be the outermost layer in the data package, that receives the highest score from the objective function.

At step 815, data for the selected subpackage is decompressed. This includes decompressing the summary and the subset of source data for the subpackage. This may also include decompressing the metadata for any subpackages in the next lower layer.

At step 816, a determination is made as to whether the subpackage satisfies the information need. For example, the decoder 142 sends the (uncompressed) summary to the information manager 140, and the information manager 140 determines if the information need has been satisfied. Other information may also be sent to the information manager 140 for the determination, such as the metadata for the subpackage. If the information manager 140 determines the information need has been satisfied, then the method is completed. The information manager 140, for example, receives the decompressed subset of source data for the subpackage which was decompressed with the summary. The subset of source data is provided to the information manager 140 and may be provided to the user.

If the information need is not satisfied, then the information manager 140 sends a request for more information to the decoder 142. The decoder 142 performs a drill down procedure by repeating steps 812-816 again for subpackages in the next lower layer.

If the lowest layer in the data package has been reached and the information need has not been satisfied, then the method may be ended and one or more of any previously selected subpackages may be selected. The data for these subpackages is decompressed and provided to the user. In another embodiment, a new objective function is created, and the method is repeated. The new objective function may consider broader search terms or other parameters. Alternatively, the entire data package is decompressed and presented or made available to the user. It should be noted that in many instances, when drilling down to a lower layer, the same objective function is used. However, for real-time applications, an update to the objective function may be performed, for example, to reflect available computational resources at the decoding device even if the lowest layer has not been reached.

FIG. 9 illustrates a block diagram of a general purpose computer system 900 that is operable to be used as a platform for the components of the system 100 described above. For example, the system 900 may be representative of a platform for the server 110 or one or more of the user devices 120 and 130. Components may be added or removed from the general purpose system 900 to provide the desired functionality.

The system 900 includes a processor 902, providing an execution platform for executing software. Commands and data from the processor 902 are communicated over a communication bus 903. The system 900 also includes a main memory 906, such as a Random Access Memory (RAM), where software may reside during runtime, and a secondary memory 908. The secondary memory 908 may include, for example, a nonvolatile memory where a copy of software is stored. In one example, the secondary memory 908 also includes ROM (read only memory), EPROM (erasable, programmable ROM), EEPROM (electrically erasable, programmable ROM).

The system 900 includes I/O devices 910. The I/O devices may include a display and/or user interfaces comprising one or more I/O devices 910, such as a keyboard, a mouse, a stylus, speaker, and the like. A communication interface 913 is provided for communicating with other components. The communication interface 913 may be a wired or a wireless interface. The communication interface 913 may be a network interface. The components of the system 900 may communicate over a bus 909.

One or more of the steps of the methods described above and other steps described herein and software described herein may be implemented as software embedded or stored on a computer readable medium. The steps may be embodied by a computer program, which may exist in a variety of forms both active and inactive. For example, they may exist as software program(s) comprised of program instructions in source code, object code, executable code or other formats for performing some of the steps when executed. Modules include software, such as programs, subroutines, objects, etc. Any of the above may be stored on a computer readable medium, which include storage devices and signals, in compressed or uncompressed form. Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated herein may be performed by any electronic device capable of executing the above-described functions.

While the embodiments have been described with reference to examples, those skilled in the art will be able to make various modifications to the described embodiments without departing from the true spirit and scope. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A method of decoding a hierarchical multi-layer data package, the method comprising:
- an objective function module, implemented by a processor executing instructions stored in a memory, creating an objective function based on parameters for identifying data in the data package most relevant to information of interest, the objective function providing a representation describing a relevance of identified data to the information of interest and an amount of data decompression to find the identified data;
- parsing, using the processor, a first layer in the hierarchical multi-layer data package to identify any subpackages in the first layer;
- evaluating, using the processor, the subpackages using the objective function and information from each subpackage;
- selecting, using the processor, a subpackage based on the evaluation to identify the subpackage most relevant to information of interest;
- determining, using the processor, whether the selected subpackage satisfies an information need;
- providing, using the processor, decompressed data for the selected subpackage if the information need is satisfied;
- identifying, by evaluating, using the processor, one or more subpackages in a next lower layer of the hierarchical multi-layer data package using the objective function and information from the one or more subpackages in the next lower layer of the hierarchical multi-layer data package, using the processor, a subpackage in the next lower layer of the hierarchical multi-layer data package likely to be most relevant to the information of interest if the information need is not satisfied;
- wherein creating the objective function comprises using device attributes and information associated with the information of interest to create the objective function, and
- wherein evaluating the subpackages using the objective function comprises using the device attributes and the information associated with the information of interest to evaluate the subpackages and to select a subpackage most relevant to the information of interest.

2. The method of claim 1, wherein identifying, by evaluating, using the processor, one or more subpackages in the next lower layer of the data package comprises: using the objective function to identify the subpackage in the next lower layer.

3. The method of claim 1, wherein identifying, by evaluating, using the processor, one or more subpackages in the next lower layer of the hierarchical multi-layer data package comprises: identifying a subpackage in the next lower layer from metadata in the first layer for the subpackage, wherein the subpackage in the next lower layer is related to the selected subpackage in the first layer.

4. The method of claim 1, further comprising:
- determining whether the next lower layer is a lowest layer in the hierarchical multi-layer data package; and if the information need is not satisfied and the next lower layer is the lowest layer in the hierarchical multi-layer data package, then creating a new objective function for evaluating subpackages in the first layer of the hierarchical multi-layer data package.

5. The method of claim 1, further comprising:
- determining whether the next lower layer is a lowest layer in the hierarchical multi-layer data package; and if the information need is not satisfied and the next lower layer is the lowest layer in the hierarchical multi-layer data package, then decompressing data for any previously identified subpackages in higher layers in the hierarchical multi-layer data package or decompressing all the data in the hierarchical multi-layer data package.

6. The method of claim 1, wherein each layer or subpackage in each layer of the hierarchical multi-layer data package includes metadata describing the device attributes and information for encoding or decoding data for a subpackage.

7. The method of claim 6, wherein the metadata includes encoding or decoding statistics for each subpackage, and evaluating the subpackages comprises:
- using the encoding or decoding statistics to select the subpackage most relevant to the information of interest.

8. The method of claim 1, wherein each subpackage comprises a summary and associated compressed data, wherein the summary describes the associated compressed data.

9. The method of claim 8, wherein determining whether the selected subpackage satisfies an information need comprises using the summary to determine whether the selected subpackage satisfies the information need; and the method further comprises decompressing the associated compressed data if the information need is satisfied.

10. The method of claim 1, wherein the objective function represents tradeoffs between at least some of goodness of fit for information in a subpackage being evaluated, device attributes and decompression time of the information in the subpackage being evaluated.

11. A device comprising:
- a hierarchical decoder decoding a hierarchical multi-layer data package including a plurality of layers and one or more subpackages in each layer,
- whereby a subpackage in an outer layer is related to a subpackage in an inner layer and each subpackage includes metadata describing its encoding,
- a summary of a subset of data in the hierarchical multi-layer data package and a link or ID of the subset of data in a compressed form, the hierarchical decoder creating an objective function based on parameters for identifying data in the hierarchical multi-layer data package most relevant to information of interest, the objective function providing a representation describing a relevance of identified data to information of interest and an amount of data decompression to find the identified data and,
- wherein the decoding includes selecting a subpackage in a layer in the hierarchical multi-data package that is associated to information of interest evaluates
- evaluating subpackages in one or more layers in the hierarchical multi-layer data package using the objective function to select the selected subpackage;
- an information manager receiving at least one of the summary for the selected subpackage and the metadata for the subpackage and determines from at least one of the received summary and the metadata whether the selected hierarchical multi-layer data package satisfies an information need or whether to identify one or more other subpackages in one or more lower levels in the hierarchical multi-layer data package,
- wherein creating the objective function comprises using the device attributes and information associated with the information of interest to create the objective function and
- wherein evaluating the subpackages using the objective function comprises using the device attributes and the information associated with the information of interest to evaluate the subpackages and to select a subpackage most relevant to the information of interest.

12. The device of claim 11, wherein if the information manager determines that more information is needed, the information manager sends a request to the hierarchical decoder requesting information for other subpackages.

13. The device of claim 11, wherein if the information manager determines that the selected subpackage satisfies the information need, the information manager sends a request to the hierarchical decoder to decompress the subset of data for the subpackage.

14. The device of claim 11, wherein the parameters comprise attributes for the device and other devices that the device communicates with and information identifying the information of interest.

15. A computer program embedded on a non-transitory computer readable storage medium, the computer program including instructions for performing a method of decoding a hierarchical multi-layer data package, comprising:
creating an objective function based on parameters for identifying data in the data package most relevant to information of interest,
the objective function providing a representation describing a relevance of identified data to the information of interest and an amount of data decompression to find the identified data; parsing a first layer in the hierarchical multi-layer data package to identify any subpackages in the first layer;
evaluating the subpackages using the objective function and information from each subpackage;
selecting a subpackage based on the evaluation to identify the subpackage most relevant to information of interest;
determining whether the selected subpackage satisfies an information need; providing decompressed data for the subpackage if the information need is satisfied; and identifying, by evaluating one or more subpackages in a next lower layer of the hierarchical multi-layer data package using the objective function and information from the one or more subpackages in the next lower layer of the hierarchical multi-layer data package, a subpackage in the next lower layer of the hierarchical multi-layer data package likely to be most relevant to the information of interest if the information need is not satisfied;
wherein creating the objective function comprises using the device attributes and information associated with the information of interest to create the objective function, and
wherein evaluating the subpackages using the objective function comprises:
using the device attributes and the information associated with the information of interest to evaluate the subpackages and to select a subpackage most relevant to the information of interest.

16. The computer program of claim 15, wherein identifying, by evaluating one or more subpackages in the next lower layer of the hierarchical multi-layer data package using the objective function and information from the one or more subpackages in the next lower layer of the hierarchical multi-layer data package, the subpackage in the next lower layer of the hierarchical multi-layer data package comprises: using the objective function to identify the subpackage in the next lower layer.

17. The computer program of claim 15, wherein identifying, by evaluating one or more subpackages in the next lower layer of the hierarchical multi-layer data package using the objective function and information from the one or more subpackages in the next lower layer of the hierarchical multi-layer data package, the subpackage in the next lower layer of the hierarchical multi-layer data package comprises: identifying the subpackage in the next lower layer from metadata in the first layer for the subpackage, wherein the subpackage in the next lower layer is related to the selected subpackage in the first layer.

* * * * *